United States Patent
Anderson et al.

(10) Patent No.: US 12,389,582 B2
(45) Date of Patent: Aug. 12, 2025

(54) HIGH DENSITY STACKED VERTICAL TRANSISTOR STATIC RANDOM ACCESS MEMORY STRUCTURE

(71) Applicant: INTERNATIONAL BUSINESS MACHINES CORPORATION, Armonk, NY (US)

(72) Inventors: Brent A Anderson, Jericho, VT (US); Albert M Chu, Nashua, NH (US); Junli Wang, Slingerlands, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 771 days.

(21) Appl. No.: 17/657,446

(22) Filed: Mar. 31, 2022

(65) Prior Publication Data
US 2023/0320055 A1 Oct. 5, 2023

(51) Int. Cl.
*H10B 10/00* (2023.01)
*G11C 11/408* (2006.01)

(52) U.S. Cl.
CPC .......... *H10B 10/12* (2023.02); *G11C 11/4085* (2013.01); *H10B 10/18* (2023.02)

(58) Field of Classification Search
None
See application file for complete search history.

(56) References Cited

U.S. PATENT DOCUMENTS

| | | | | |
|---|---|---|---|---|
| 6,137,129 | A | * 10/2000 | Bertin | H10B 10/00 257/302 |
| 9,680,473 | B1 | 6/2017 | Anderson | |
| 10,134,893 | B2 | 11/2018 | Anderson | |
| 10,593,681 | B1 | 3/2020 | Rubin | |
| 10,629,602 | B2 | 4/2020 | Mann | |
| 10,833,081 | B2 | 11/2020 | Zhang | |
| 11,004,856 | B1 | 5/2021 | Zhang | |
| 2017/0256549 | A1* | 9/2017 | Keng | H10B 10/12 |
| 2019/0385946 | A1 | 12/2019 | Xie | |
| 2021/0408011 | A1 | 12/2021 | Fujiwara | |
| 2022/0013165 | A1* | 1/2022 | Yang | H10B 10/12 |

OTHER PUBLICATIONS

International Searching Authority, "Invitation to Pay Additional Fees and, Where Applicable, Protest Fee", International application No. PCT/EP2023/056314, International Filing Date Mar. 13, 2023, Mailed on Jun. 22, 2023, 9 pages.

* cited by examiner

*Primary Examiner* — Hung K Vu
(74) *Attorney, Agent, or Firm* — Gavin Giraud

(57) ABSTRACT

Embodiments disclosed herein include a semiconductor structure. The semiconductor structure may include a static random access memory (SRAM) cell. The SRAM cell may include a first section of the SRAM cell with a first pull-up transistor, first pull-down transistor, and first pass-gate transistor. The SRAM cell may include a second section of the SRAM cell with a second pull-up transistor, second pull-down transistor, and second pass-gate transistor. The first section of the SRAM cell and the second section of the SRAM cell may be arranged in a non-rectangular cell layout with the first pass-gate located at a first end of the non-rectangular cell layout and the second pass-gate at a second end of the non-rectangular cell layout opposite the first end.

20 Claims, 3 Drawing Sheets

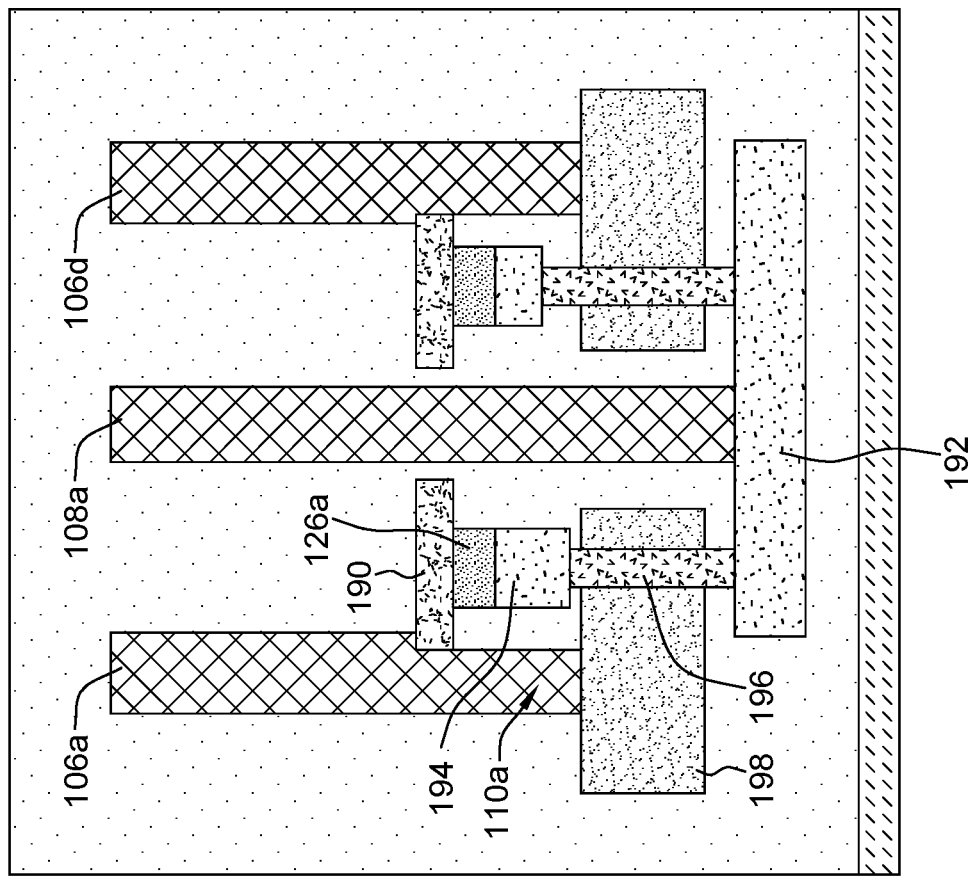
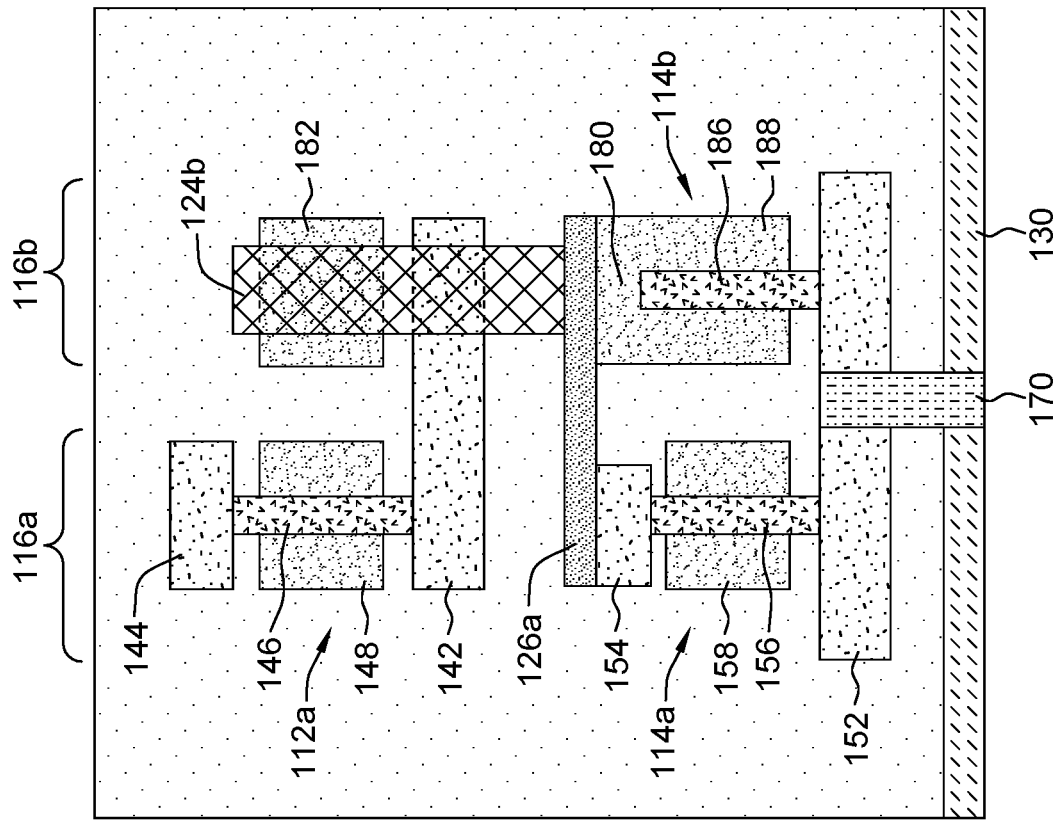
FIG. 4
FIG. 3

HIGH DENSITY STACKED VERTICAL TRANSISTOR STATIC RANDOM ACCESS MEMORY STRUCTURE

BACKGROUND

The present invention relates generally to the field of static random-access memory (SRAM), and more particularly to a stacked VTFET.

SRAM is a type of random-access memory (RAM) that uses latching circuitry (flip-flop) to store each bit. SRAM is volatile memory, so the stored data is lost when power is removed. The term static differentiates SRAM from DRAM (dynamic random-access memory) which must be periodically refreshed. SRAM is faster and more expensive than DRAM; it is typically used for the cache and internal registers of a CPU while DRAM is used for a computer's main memory.

A typical SRAM cell is made up of six MOSFETs, and is often called a 6T SRAM cell. Each bit in the cell is stored on four transistors that form two cross-coupled inverters. This storage cell has two stable states which are used to denote 0 and 1. Two additional access transistors serve to control the access to a storage cell during read and write operations. Access to the cell is enabled by the word line which controls the two access transistors which, in turn, control whether the cell should be connected to the bit lines. They are used to transfer data for both read and write operations. Although it is not strictly necessary to have two bit lines, both the signal and its inverse are typically provided in order to improve noise margins.

During read accesses, the bit lines are actively driven high and low by the inverters in the SRAM cell. This improves SRAM bandwidth compared to DRAMs—in a DRAM, the bit line is connected to storage capacitors and charge sharing causes the bit line to swing upwards or downwards. The symmetric structure of SRAMs also allows for differential signaling, which makes small voltage swings more easily detectable.

SUMMARY

Aspects of an embodiment of the present invention include a semiconductor structure. The semiconductor structure may include a static random access memory (SRAM) cell. The SRAM cell may include a first section of the SRAM cell with a first pull-up transistor, first pull-down transistor, and first pass-gate transistor. The SRAM cell may include a second section of the SRAM cell with a second pull-up transistor, second pull-down transistor, and second pass-gate transistor. The first section of the SRAM cell and the second section of the SRAM cell may be arranged in a non-rectangular cell layout with the first pass-gate located at a first end of the non-rectangular cell layout and the second pass-gate at a second end of the non-rectangular cell layout opposite the first end.

Aspects of an embodiment of the present invention may include a vertical transistor static random access memory (VT-SRAM) device. The VT-SRAM device may include a first pull-down transistor having a first gate and a first pull-down active channel fin, a first pull-up transistor vertically above the first pull-down transistor, a first pass-gate transistor with a first pass-gate fin laterally aligned on a first layout line with the first pull-down active channel fin, and a first vertical gate contact electrically connected to and vertically above the first gate.

Aspects of an embodiment of the present invention may include a semiconductor structure. The semiconductor structure may include an NFET device layer, a PFET device layer vertically above the NFET device layer, a vertical gate contact, a pull-down transistor in the NFET device layer having a contact-over-active gate with lateral sides around a first portion of a pull-down fin, and a top side connected between the first portion of the pull-down fin and the vertical gate contact, and a pull-up transistor in the PFET device layer directly above a second portion of the pull-down fin.

BRIEF DESCRIPTION OF THE DRAWINGS

FIG. 3 depicts a schematic cross-sectional diagram of the semiconductor structure of FIG. 1, in accordance with one embodiment of the present invention.

FIG. 4 depicts a schematic cross-sectional diagram of the semiconductor structure of FIG. 1, in accordance with one embodiment of the present invention.

DETAILED DESCRIPTION

Figure 1:
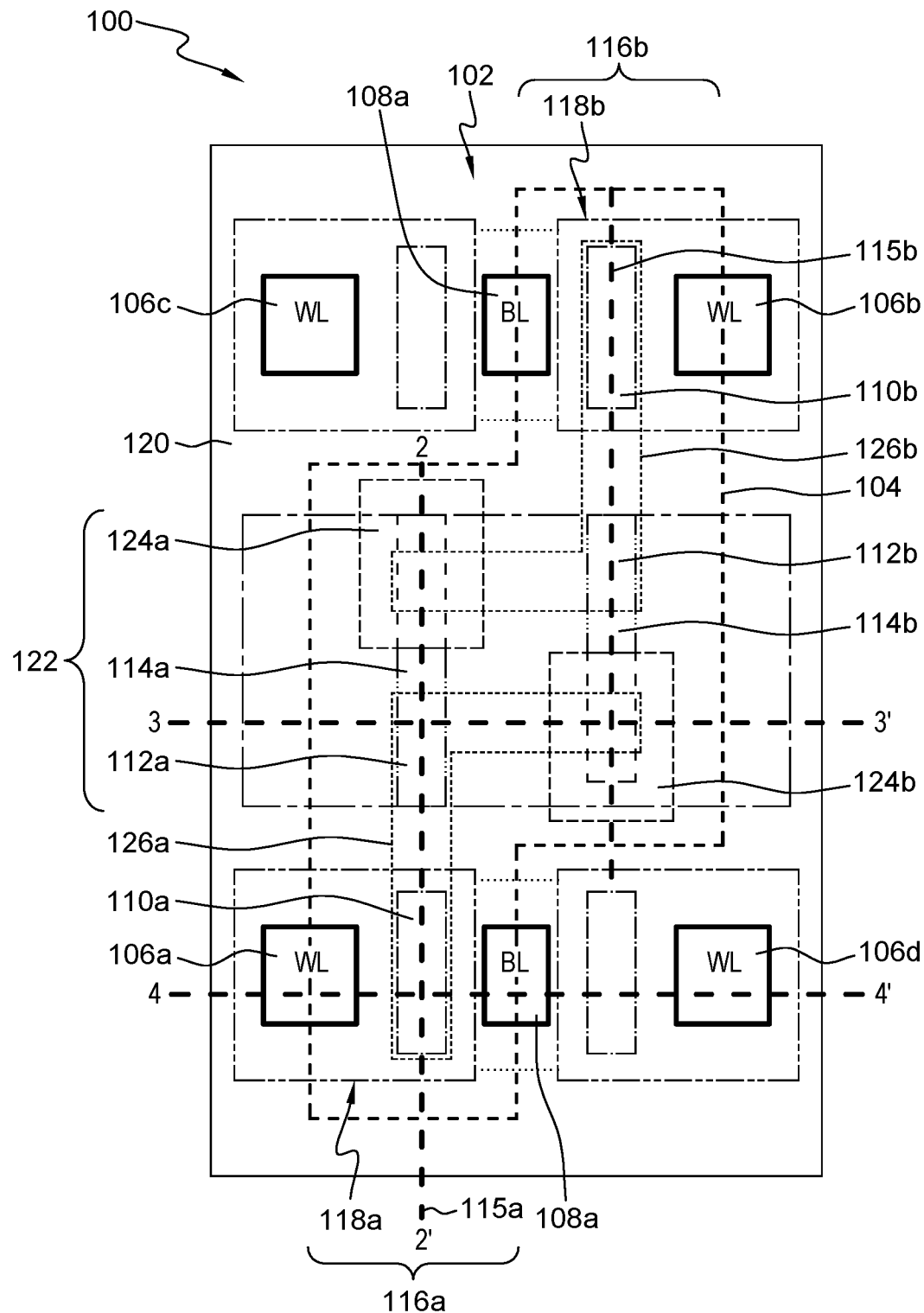
FIG. 1 depicts a schematic top see-through view of a semiconductor structure having a vertical transistor static random-access memory (VT-SRAM or SRAM) cell with a non-rectangular cell layout, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the fabrication of embedded static random access memory (SRAM) devices within the metal contact layers of a semiconductor structure, a smaller cell area enables more cells to fit on an integrated circuit chip, and potentially reduces the power needed to operate the SRAM cells. Embodiments disclosed herein, therefore, include stacked vertical transistor SRAM (VT-SRAM) with pull-down transistors with pull-up transistors vertically above the pull-down transistors. Embodiments also include a vertical gate contact to enable contact to the pull-down and pull-up transistors without requiring extra room. Therefore, the total cell layout is a non-rectangular layout with two stacks (each including a pull-up transistor and a pull-down transistor) arranged as a two-fin wide middle area, and single pass-gate transistors on either end connecting the SRAM cell to a bit line and a bit line bar.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, landing pad 106 may refer to a single landing pad 106 or multiple landing pads 106.

The present invention will now be described in detail with reference to the Figures.

FIG. 1 depicts a schematic top see-through view of a semiconductor structure 100 having a vertical transistor static random-access memory (VT-SRAM or SRAM) cell 102 with a non-rectangular cell layout 104. Certain components of the SRAM cell 102 are visible through other components even though the components are located above or below the other components. The SRAM cell 102 is electrically connected between a first word line 106a and a second word line 106b, and between a bit line 108a and a bit line bar 108b. The illustrated embodiment shows additional word lines 106c, d, but the additional word lines are used in different other SRAM cells beside the instant SRAM cell 102. The word lines 106a, b and the bit lines 108a, b may include contacts formed of electrically conductive materials such as copper, tungsten, cobalt, ruthenium, aluminum, other metals, or conductive non-metals. The word lines 106a, b and bit lines 108a, b are insulated from other components by dielectric 120. The dielectric 120 may include a non-crystalline solid material such as SiN, SiC, SiCN(H), or other silicon compounds for insulating, silicon dioxide (SiO2) undoped silicate glass (USG), tetraethyl orthosilicate (TEOS), low-κ dielectric, or ultra low-κ dielectric materials, fluorosilicate glass (FSG), borophosphosilicate glass (BPSG), a spin-on low-κ dielectric layer, a chemical vapor deposition (CVD) low-κ dielectric layer or any combination thereof.

Electrically connected between the word lines 106a, b and the bit lines 108a, b, the SRAM cell 102 includes six transistors: a first pass gate transistor 110a, a first pull-up transistor 112a, a first pull-down transistor 114a along a first layout line 115a in a first section 116a of the cell layout 104, and a second pass gate transistor 110b, a second pull-up transistor 112b, and a second pull-down transistor 114b along a second layout line 115b in a second section 116b of the cell layout 104. The first pass gate transistor 110a is connected on a first end 118a of the cell layout 104 while the second pass gate transistor 110b is connected on a second end 118b opposite the first end 118a. The first pull-up transistor 112a, the first pull-down transistor 114a, the second pull-up transistor 112b, and the second pull-down transistor 114b are arranged in a bit storage region 122 located laterally between the word lines 106a, b, c, d and the bit lines 108a, b. The first pull-up transistor 112a, the first pull-down transistor 114a, the second pull-up transistor 112b, and the second pull-down transistor 114b are arranged in a two-fin wide arrangement with the pull-up transistors 112a, b vertically above the pull-down transistors 114a, b; a relationship that is visible in the cross-sectional views below.

The first pull-up transistor 112a, the first pull-down transistor 114a, the second pull-up transistor 112b, and the second pull-down transistor 114b are conveyed control signals through: a first gate contact 124a located in the first section 116a of the cell layout 104, and a second gate contact 124b located in the second section 116b of the cell layout 104. The SRAM cell 102 also includes a first wire 126a that electrically connects the first pull-down transistor 114a and the first pass gate transistor 110a to the second gate contact 124b. The SRAM cell 102 also includes a second wire 126b that electrically connects the second pull-down transistor 114b and the second pass gate transistor 110b to the first gate contact 124a. As illustrated below, the wires 126a, b are located between a top layer of the SRAM cell 102 and a bottom layer of the SRAM cell 102. The SRAM cell 102 also includes a ground contact.

Figure 2:
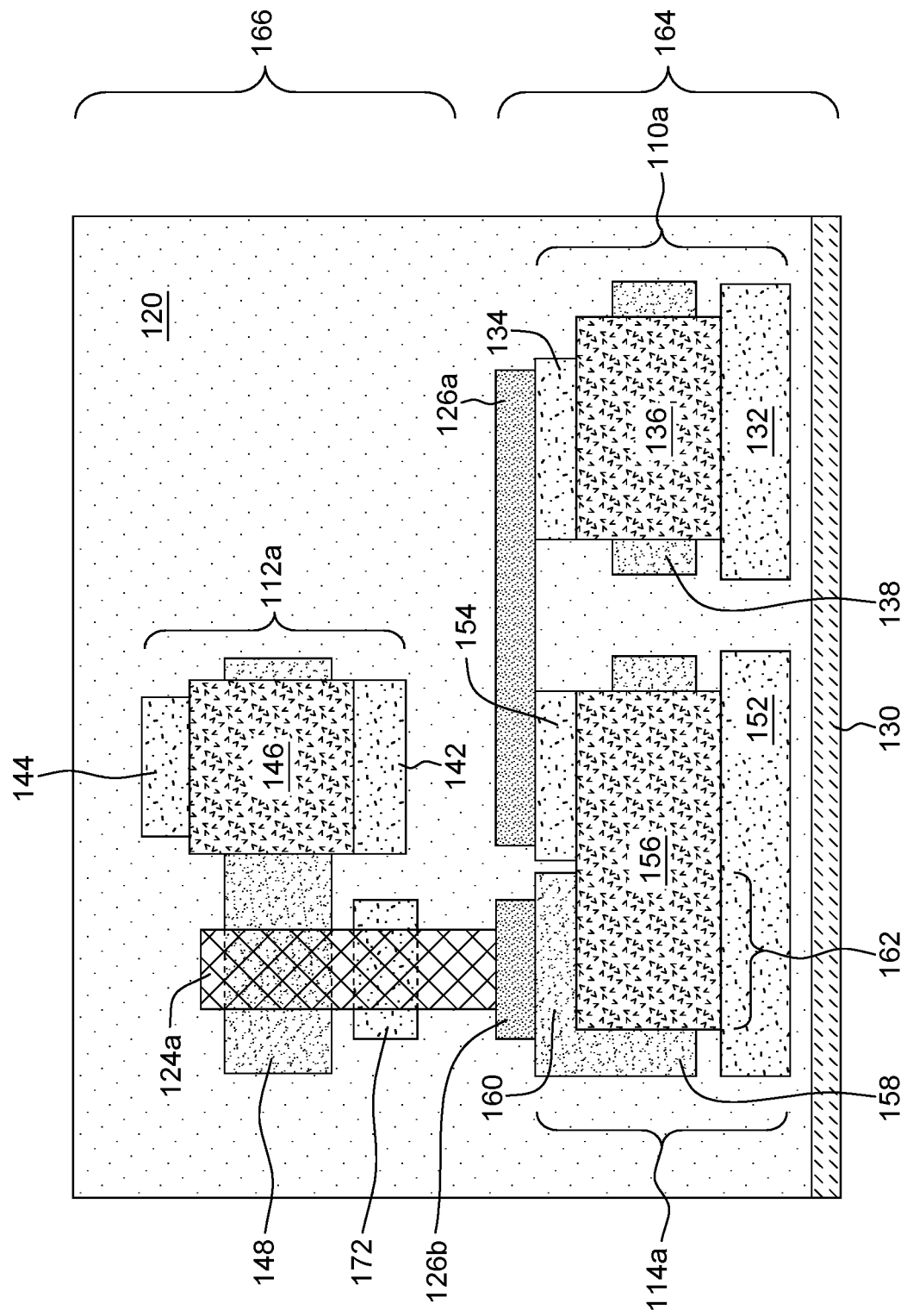
FIG. 2 depicts a schematic cross-sectional diagram of the semiconductor structure of FIG. 1, in accordance with one embodiment of the present invention.

FIG. 2 depicts a cross-sectional side view along the first layout line 115a (which is also line 2-2') of the semiconductor structure 100 of FIG. 1, in accordance with one embodiment of the present invention. The first layout line 115a includes the first pass gate transistor 110a, the first pull-up transistor 112a, and the first pull-down transistor 114a. The SRAM cell 102 is fabricated on a substrate 130 of silicon or similar material. The first pass gate transistor 110a includes a bottom source/drain (S/D) 132, a top S/D 134, an active channel fin 136, and a gate 138. The first pull-up transistor 112a also includes a bottom S/D 142, a top S/D 144, an active channel fin 146, and a gate 148. The first pull-down transistor 114a also includes a bottom source/drain (S/D) 152, a top S/D 154, an active channel fin 156, and a gate 158. The S/Ds are typically formed by epitaxial growth of a highly doped semiconductor.

The gates 138, 148, 158 wrap around the active channel fins 136, 146, 156 for faster and more assured activation of the active channel fins 136, 146, 156. The gate 158 of the first pull-down transistor 114a, however, may also include a contact-over-active gate 158 that has a top side 160 connected over a first portion 162 of the first pull-down active channel fin 156 and between the first vertical gate contact 124a. The top side 160 and the lateral sides 160 are typically fabricated into one solid gate structure of the contact-overactive gate 158. The first pull-down active channel fin 156 may be elongated to accommodate the first vertical gate contact 124a and the first pull-up transistor 112a being fabricated vertically above the first pull-down transistor 114a.

The first wire 126a, the second wire 126b, and the first gate contact 124a are also shown in FIG. 2. The first wire 126a electrically connects: (i) the first pass gate top S/D 134; (ii) the first pull-down top S/D 154; and (iii) (unillustrated in FIG. 2) a second pull-down gate of the second pull-down transistor 114b. The second wire 126b electrically connects: (i) the pull-down gate 158 of the first pull-down transistor 114b, (ii) (unillustrated in FIG. 2) a second pull-down top S/D of the second pull-down transistor 114b; and (iii) (unillustrated in FIG. 2) a second pass gate top S/D of the second pass gate transistor 110b. The wires 126a, b may be fabricated in an area between field-effect transistor (FET) layers, and may be formed of electrically conductive materials such as copper, tungsten, cobalt, ruthenium, aluminum, other metals, or conductive non-metals. That is, the semiconductor structure 100 and the SRAM cell 102 may be fabricated with a first layer 164 and a second layer 166. The first layer 164 includes the pass gate transistors 110a, b and the pull-down transistors 114a, b. The second layer 166 includes the pull-up transistors 112a, b. The first layer 164 and the second layer 166 will have different types of semiconductor. For example, if the first layer 164 is a PFET type semiconductor layer, then the second layer 166 will be an NFET type semiconductor layer. Similarly, if the first layer 164 is an NFET type semiconductor layer, then the second layer 166 will be a PFET type semiconductor layer.

FIG. 2 also illustrates a bottom S/D 172 of the second pull-up transistor 112b (active channel fin for the second pull-up transistor 112b is not illustrated in FIG. 2). The bottom S/D 172 contacts the first vertical gate contact 124a and extends (i.e., deeper into the page) to the second pull-up transistor 112b. Similarly, the bottom S/D 142 of the first pull-up transistor 112a also extends (i.e., deeper into the page in FIG. 2, and left to right in FIG. 3) and contacts the second vertical gate contact 124b. Thus, each vertical gate contact 124a, b is connected to two gates and three S/Ds. Specifically, the first vertical gate contact 124a, is directly connected to: (i) the gate 148 of the first pull-up transistor 112a and (ii) the S/D 172 of the second pull-up transistor 112b, and is connected through the second wire 126b to: (i) the gate 158 of the first pull-down transistor 114a, (ii) the top S/D of the second pull-down transistor 114b (not illustrated in FIG. 2), and (iii) the top S/D of the second pass gate transistor 110b (not illustrated in FIG. 2).

FIG. 3 depicts a cross-sectional side view along line 3-3' of the semiconductor structure 100 of FIG. 1, in accordance with one embodiment of the present invention. The view shows the first pull-up transistor 112a, the first pull-down transistor 114a, the second pull-down transistor 114b, and the second vertical gate contact 124b. As described above, the bottom S/D 142 of the first pull-up transistor 112a extends from the first section 116a of the cell layout 104 to the second section 116b of the cell layout 104, and connects to the second vertical gate contact 124b. The first wire 126a likewise extends from the first section 116a to the second section 116b. The bottom S/D 152 of the first pull-down transistor 114a also extends from the first section 116a to the second section 116b, and doubles as a bottom S/D of the second pull-down transistor 114b. The bottom S/D 152 may be connected to the substrate 130 by a backside contact 170 to supply ground to the first pull-down transistor 114a and the second pull-down transistor 114b.

The second pull-down transistor 114b also includes an active channel fin 186 and a gate 188. The cross-sectional view of FIG. 3 only shows a first portion of the second pull-down transistor 114b. The first portion of the second pull-down transistor 114b includes a contact-over-active gate 188 that has a top side 180 between the active channel fin 186 and the second gate contact 124b. At a second portion of the second pull-down transistor 114b deeper into the page (i.e., not illustrated in FIG. 3) the top side 180 is not present, and a top S/D of the second pull-down transistor 114b is positioned above the active channel fin 186 instead of the top side 180 of the gate 188. Above the gate 188, the second vertical gate contact 124 connects to a gate 182 of the second pull-up transistor 112b.

FIG. 4 depicts a cross-sectional side view along line 4-4' of the semiconductor structure 100 of FIG. 1, in accordance with one embodiment of the present invention. FIG. 4 shows the first pass gate transistor 110a and another pass gate transistor from a different SRAM cell. The first pass gate transistor 110a includes a bottom S/D 192, a top S/D 194, an active channel fin 196, and a gate 198. The gate 198 is connected to the first word line 106a and the bottom S/D 192 is connected to the bit line 108a. The first pass gate transistor 110a is also connected to the rest of the SRAM cell 102 through the first wire 126a. The semiconductor structure 100 also includes a self-aligned etch stop layer 190 above the first pass gate transistor 110a.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A static random access memory (SRAM) cell, comprising:
a first section of the SRAM cell comprising a first pull-up transistor, first pull-down transistor, and first pass-gate transistor;
a second section of the SRAM cell comprising a second pull-up transistor, second pull-down transistor, and second pass-gate transistor;
wherein the first section of the SRAM cell and the second section of the SRAM cell are arranged in a non-rectangular cell layout with the first pass-gate located at a first end of the non-rectangular cell layout and the second pass-gate at a second end of the non-rectangular cell layout opposite the first end, and wherein the first pass-gate comprises lateral sides around a first portion of a pull-down fin and the first pull-up transistor is directly above a second portion of the pull-down fin.

2. The SRAM cell of claim 1, wherein the first pull-up transistor and the second pull-up transistor comprise a first type of semiconductor selected from the group consisting of: a PFET and an NFET, and the first pull-down transistor, the second pull-down transistor, the first pass-gate transistor, and the second pass-gate transistor comprise a second type of semiconductor different from the first type.

3. The SRAM cell of claim 1, wherein a first gate contact is electrically connected to a bottom source/drain of the second pull-up transistor and a contact-over-active gate of the first pull-down transistor.

4. The SRAM cell of claim 3, wherein a second gate contact is electrically connected to a bottom source/drain of the first pull-up transistor and a contact-over-active gate of the second pull-down transistor.

5. The SRAM cell of claim 3, wherein the first gate contact is positioned above the first pull-down transistor and is in line with a layout line of the first pull-up transistor.

6. The SRAM cell of claim 1, further comprising a self-aligned etch stop layer above the first pass-gate transistor.

7. The SRAM cell of claim 1, further comprising a ground contact connecting the first pull-down transistor and the second pull-down transistor to a substrate, wherein the ground contact is located between the first section of the SRAM cell and the second section of the SRAM cell.

8. A vertical transistor static random access memory (VT-SRAM) device, comprising:
a first pull-down transistor comprising a first gate and a first pull-down active channel fin;
a first pull-up transistor vertically above the first pull-down transistor;
a first pass-gate transistor comprising a first pass-gate fin laterally aligned on a first layout line with the first pull-down active channel fin; and
a first vertical gate contact electrically connected to and vertically above the first gate.

9. The VT-SRAM device of claim 8, wherein the first pull-up transistor comprises an active channel fin region of a first type of semiconductor, and the first pull-down transistor comprises an active channel fin region of a second type of semiconductor.

10. The VT-SRAM device of claim 8, wherein the first gate comprises a contact-over-active gate comprising lateral sides around the first pull-down active channel fin, and a top side connected between the first pull-down active channel fin and the first vertical gate contact.

11. The VT-SRAM device of claim 8, further comprising:
a second vertical gate contact electrically connected to the first pull-up transistor and electrically insulated from the first vertical gate contact, wherein the second vertical gate contact is located off the layout line.

12. The VT-SRAM device of claim 8, further comprising:
a second pull-up transistor connected to a second vertical gate contact;
a second pull-down transistor connected to the second vertical gate contact; and
a second pass-gate transistor connected to the second vertical gate contact, wherein the second pull-up transistor is vertically above the second pull-down transistor, and the second pass-gate transistor are arranged laterally in a second layout line.

13. The VT-SRAM device of claim 8, wherein the first pass-gate transistor is coupled to a first word line.

14. The VT-SRAM device of claim 8, further comprising a self-aligned etch stop layer above the first pass-gate transistor.

15. A semiconductor structure, comprising:
an NFET device layer;
a PFET device layer vertically above the NFET device layer;
a vertical gate contact;
a pull-down transistor in the NFET device layer comprising a contact-over-active gate comprising lateral sides around a first portion of a pull-down fin, and a top side connected between the first portion of the pull-down fin and the vertical gate contact; and
a pull-up transistor in the PFET device layer directly above a second portion of the pull-down fin.

16. The semiconductor structure of claim 15, further comprising a shared bit line connection on a first end of the NFET device layer and a shared bit line bar connection on a second end of the NFET device layer opposite the first end.

17. The semiconductor structure of claim 16, further comprising a pass-gate transistor in the NFET device layer comprising a pass-gate fin laterally aligned in a layout line with the pull-down fin.

18. The semiconductor structure of claim 17, wherein the pass-gate transistor is connected to a selection consisting of: the shared bit line connection and the shared bit line bar connection.

19. The semiconductor structure of claim 17, further comprising a self-aligned etch stop layer above the pass-gate transistor.

20. The semiconductor structure of claim 15, further comprising a ground contact connecting the pull-down transistor to a substrate.

* * * * *